United States Patent
Kawase

[11] Patent Number: 6,060,716
[45] Date of Patent: May 9, 2000

[54] ELECTRON BEAM LITHOGRAPHY METHOD

[75] Inventor: Yuich Kawase, Tokyo, Japan

[73] Assignee: JEOL Ltd., Tokyo, Japan

[21] Appl. No.: 09/047,749

[22] Filed: Mar. 25, 1998

[30] Foreign Application Priority Data

Mar. 28, 1997 [JP] Japan ................................. 9-077048

[51] Int. Cl.[7] .............................................. H01J 37/302
[52] U.S. Cl. ................................................. 250/492.22
[58] Field of Search ................................. 250/492.22

[56] References Cited

U.S. PATENT DOCUMENTS 4,532,598  7/1985  Shibayama et al. ................ 364/491

FOREIGN PATENT DOCUMENTS 59-79526  5/1984  Japan ................................ 250/492.2

*Primary Examiner*—Jack Berman
*Attorney, Agent, or Firm*—Webb Ziesenheim Logsdon Orkin & Hanson, P.C.

[57] ABSTRACT

There is disclosed an electron beam lithography method of writing a pattern faithfully although the pattern is divided into elements and these elements are written. The desired pattern to be written is divided into x and y elements by line segments parallel to the x- and y-axes, respectively. Data about the x elements are stored in an x data memory. Data about the y elements are stored in a y data memory. Under control of a writing control unit, an electron beam is shot at a target material according to the data stored in the x data memory at a dose which is half the dose with which a pattern is written in one shot. Then, the beam is then shot at the target material at the same dose according to the data stored in the y data memory.

2 Claims, 2 Drawing Sheets

ELECTRON BEAM LITHOGRAPHY METHOD

FIELD OF THE INVENTION

The present invention relates to an electron beam lithography method of writing a desired pattern on a target material coated with a photosensitive material by irradiating it with an electron beam.

BACKGROUND OF THE INVENTION

In electron beam lithography, an electron beam is directed at a target material coated with a photosensitive material to write a desired pattern on the target material. When such a pattern is drawn, pattern data including the coordinates of the vertices of a polygonal pattern and the lengths taken in the x- and y-directions are generated by CAD. The data are then converted into a form that can be used by an electron beam lithography system in writing a pattern. The lithography system deflects the electron beam and/or moves the target material according to the converted data. As a result, the desired pattern is drawn.

For example, in vector scan, an electron beam is deflected to a portion to be written within a given field whenever the target material is stepped in the x- and y- directions. In this technique, a chip pattern having a complex polygonal pattern to be written is divided into simple rectangles or trapezoids.

When the polygonal pattern is divided into rectangles or trapezoids, the smoothness of the original geometrical pattern is lost. For instance, when an undivided polygonal pattern P indicated by the solid line is divided into two trapezoids $P_1$ and $P_2$ as shown in FIG. 1, the division line indicated by the broken line intersects the hypotenuse at point C. The position of this intersection C does not always overlap any one of grids that are coordinate points expressing the geometrical pattern. The grids representing coordinate points are coordinate points of a minimum unit in creating data and are indicated by x. The intersection C is approximated by a near grid G that is a vertex of the trapezoids $P_1$ and $P_2$ forming elements of the original pattern. Therefore, if these rectangles or trapezoids are recombined, the original polygonal pattern is not always regained. Note that in FIG. 1, the trapezoids $P_1$ and $P_2$ produced by the division and indicated by the broken lines are shown to be slightly shifted from the undivided polygonal pattern P indicated by the solid line for ease of understanding.

Also, once a pattern is divided into elements, it is impossible to write the pattern across the adjacent elements. Overlap writing is done in drawing each element of the pattern. In particular, whenever a shot of beam is made, the junction between two adjacently shot portions is shifted. Thus, the successively shot portions are written smoothly. However, smoothness cannot be achieved across the boundary line between the adjacent elements.

A chip pattern consisting of a polygon is divided into rectangles or trapezoids by the division method shown in FIGS. 2(a) and 2(b). Specifically, the pattern is divided by line segments that start at the vertices of the polygon and extend parallel to the x- or y-axis on the two-dimensional plane representing the chip pattern. FIG. 2(a) gives an example in which the pattern is divided by line segments parallel to the y-axis. FIG. 2(b) shows an example in which the pattern is divided by line segments parallel to the y-axis. Where this method is adopted, very small elements of quite small heights or widths may be produced. This problem is serious in the case of a variable-shaping beam electron beam lithography system.

In the variable-shaping beam electron beam lithography system, two slit plates are positioned along the optical axis. A deflector is disposed between the two slit plates to appropriately deflect the electron beam passed through the upper slit. Thus, the electron beam of the desired cross section is made to pass through the lower slit and bombard the target material. When such very small elements are written, the beam passing through the lower slit (shaped beam) becomes very small. This results in a very great decrease in the beam current density. As a result, the photosensitive material applied on top of the target material cannot be sufficiently activated. That is, if the elements of a polygon contain very small elements, the pattern cannot be drawn smoothly across the boundary between the adjacent elements.

SUMMARY OF THE INVENTION

It is an object of the present invention to provide an electron beam lithography method of writing a polygonal pattern on a target material more faithfully than conventional where the pattern is divided into plural elements.

It is another object of the invention to provide an electron beam lithography method of writing a pattern on a target material smoothly across the boundary lines between elements where the pattern is divided into such elements.

The present invention provides an electron beam lithography method of writing a desired pattern on a target material coated with an electron beam-sensitive material by controlling an electron beam impinging on the material according to data about the pattern. This method starts with dividing the pattern into first and second elements along first and second directions, respectively, that preferably are perpendicular to each other. The first and second elements are written with an electron dose about half the electron dose with which the beam-sensitive material is activated.

In one embodiment of the electron beam lithography method in accordance with the invention, the first elements of the pattern are first written and then the second elements are written.

In another embodiment of the electron beam lithography method in according the invention, the target material is moved in steps. Whenever the target material is halted, the first and second elements are written in a desired field.

Other objects and features of the invention will appear in the course of the description thereof, which follows.

DETAILED DESCRIPTION OF THE INVENTION

Figure 1:
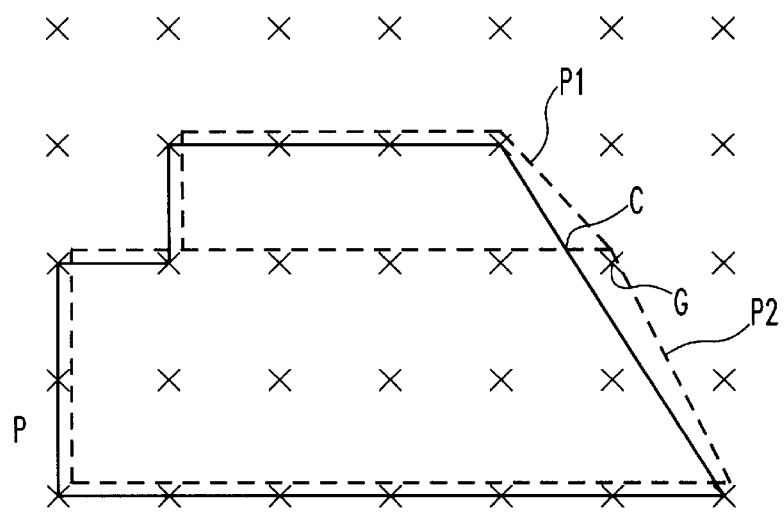
FIG. 1 is a diagram illustrating a problem occurring when a polygonal pattern is divided into elements in writing the pattern.
Figure 2A:
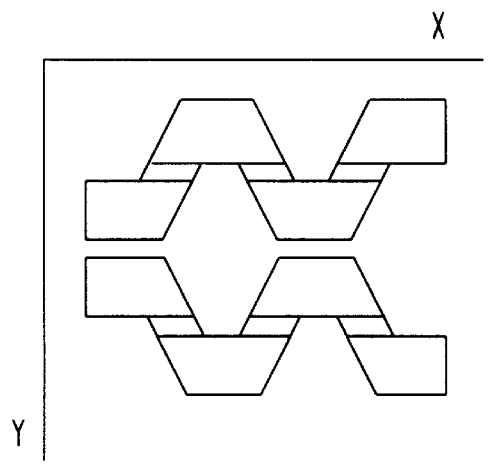
FIG. 2(a) and 2(b) are diagrams illustrating the manner in which a polygonal pattern is divided into elements by line segments extending in the x- and y-directions.
Figure 2B:
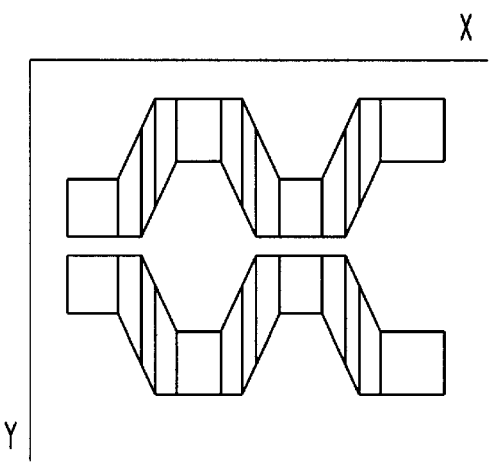
Figure 3:
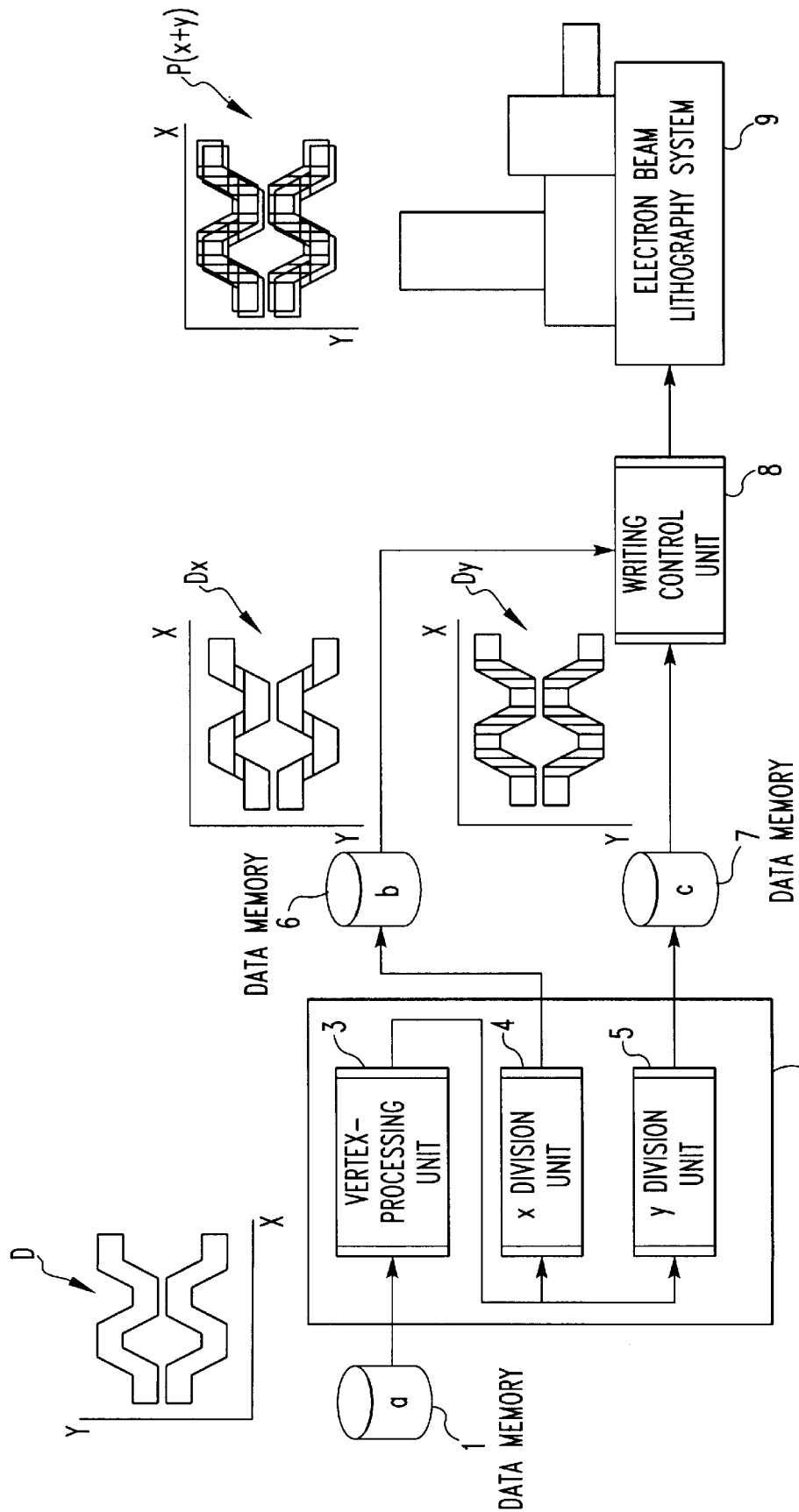
FIG. 3 is a diagram showing an electron beam lithography system for implementing a method in accordance with the present invention.

Referring to FIG. 3, there is shown an electron beam lithography system for carrying out an electron beam lithography method in accordance with the invention. Data D about writing is created by a CAD system or the like and stored in a data memory 1. The data D is read from the data memory 1 and sent to a data conversion unit 2 including a vertex-processing unit 3 that processes the vertices. The data is then sent to an x division unit 4 and to a y division unit 5, which perform processing to divide a pattern into x elements and y elements in the x- and y- directions, respectively. The output data Dx from the x division unit 4 is stored in a data memory 6. The output data Dy from the y division unit 5 is stored in a data memory 7. The data Dx is read from the data memory 6 and sent to a writing control unit 8. Similarly, the data Dy is read from the data memory 7 and fed to the writing control unit 8, which in turn controls an electron beam lithography system 9. The instrument constructed in this way operates as follows.

The data D about writing is read from the data memory 1 and sent to the data conversion unit 2, where the vertex-processing unit 3 first performs processing about the vertices. For example, the data D is data about a chip pattern in the form of a polygon. Data about the positions of the vertices of the polygon are obtained from the pattern data D.

The obtained data are fed to the x division unit 4 and to the y division unit 5. The x division unit 4 divides the polygonal pattern into rectangular or trapezoidal elements by line segments starting at the vertices and extending parallel to the x-axis according to the obtained data. The output data Dx from the x division unit 4 are stored in the data memory 6.

The y division unit 5 divides the polygonal pattern into rectangular or trapezoidal elements by line segments starting at the vertices and extending parallel to the y-axis perpendicular to the x-axis according to the obtained data. The output data Dy from the y division unit 5 are stored in the data memory 7.

The writing control unit 8 controls the electron beam lithography system 9 according to the x element data Dx stored in the data memory 6. That is, the electron beam is shot at a desired portion of the target material. The electron beam is deflected according to the element data by a deflector included in the lithography system 9. Whenever a field is written, the target material or stage is moved within the lithography system 9 according to the element data.

Normally, the dose of the electron beam shot at the target material is approximately half the dose with which the electron beam activates the photosensitive material in a single shot. Namely, the photosensitive material is not activated.

The dose may also be controlled by varying the current density of the electron beam impinging on the target material. Preferably, however, the dose is controlled by halving the shot time. The shot time is controlled by varying the blanking time of the electron beam.

The writing control unit 8 controls the electron beam lithography system 9 according to the y element data Dy stored in the data memory 7. That is, the electron beam is shot at the desired portion on the target material by the electron beam lithography system. The electron beam is deflected according to the element data. Each time a field is written, the target material is moved according to the element data.

As described above for fields written with the Dx data, the dose of the electron beam shot at the target material for fields written with the Dy data is approximately half the dose with which the electron beam activates the photosensitive material in a single shot. Namely, the photosensitive material is not activated. The dose may also be controlled by varying the current density of the electron beam impinging on the target material. Preferably, however, the dose is controlled by halving the shot time.

As a result of the two shots of the electron beam, the photosensitive material on the target material is completely activated. A desired polygonal pattern P (x+y) that is a superimposition of the x and y elements according to the two kinds of data Dx and Dy is written on the target material. The resulting pattern P (x+y) is shown in such a way that the two kinds of elements are slightly shifted from each other for ease of understanding.

When a chip pattern in the form of a polygon is divided into x and y elements by line segments parallel to the x- and y-axes, the resulting x elements differ in state from the resulting y elements. For example, a hypotenuse that can be divided by one line segment is not divided by other line segments vertical to that line segment. Otherwise, the position of division may differ.

As a result, if overlap writing is done, based on the x and y elements produced by the division by means of line segments parallel to the x-axis and the y-axis, respectively, the deviations of the positions of the vertices of the elements of the pattern are averaged out. Consequently, the original polygonal pattern is written with improved faithfulness.

A chip pattern in the form of a polygon is divided into x and y elements by means of line segments parallel to the x- and y-axes that are perpendicular to each other. It may be possible that one line segment defining the boundary between two adjacent elements is located inside other elements. Therefore, the overlap of the x and y elements improves the smoothness of the polygonal pattern across the boundaries between the elements. For the same reason, even if the elements contain very small elements, the smoothness of the finished pattern is improved.

In the embodiment described above, a polygonal pattern is divided by line segments parallel to the x- and y-axes, respectively. Data about the resulting x and y elements are stored in the data memories 6 and 7, respectively. The x elements are written on the target material, and then the y elements are written on the target material. If any element extends across plural fields, then the x elements must be written on every field. Then, the y elements must be written on every field. Therefore, every field is written twice. Hence, it takes a longer time to move the target material or the stage.

This issue can be solved by the following method. Data about the x elements and data about the y elements are not stored in separate data memories. Rather, these two kinds of data are stored in a common data memory for every field. Writing is done according to the pattern data from this common data memory. The time taken to move the target material is the same as the time taken to write the x elements or y elements once for every field. In consequence, the throughput of the writing can be improved.

Having thus described my invention with the detail and particularity required by the Patent Laws, what is desired protected by Letters Patent is set forth in the following claims.

What is claimed is:

1. An electron beam lithography method for writing a desired polygonal pattern on a target material by controlling an electron beam impinging on the target material coated with an electron beam-sensitive material according to data D about the pattern, said electron beam lithography method comprising:

producing the x division data Dx by dividing said desired polygonal pattern into x patterns by line segments starting at the vertices of the polygonal Pattern and extending Parallel to the x-axis;

producing the y division data Dy by dividing said desire polygonal pattern into y Patterns by line segments starting at the vertices of the Polygonal pattern and extending parallel to the y-axis; and separately writing said x patterns based on the data Dx crossing the line segments parallel to the y-axis and writing y patterns based on the data Dy crossing line segments parallel to the x-axis by shooting said electron beam at said target material with an electron dose about half an electron dose with which said photosensitive material is activated such that the total electron dose from both writings activates said photosensitive material.

2. The electron beam lithography method of claim 1, wherein said target material is moved in steps, and wherein whenever said target material is halted, said x and y patterns are written in a desired field.

* * * * *

UNITED STATES PATENT AND TRADEMARK OFFICE
CERTIFICATE OF CORRECTION

PATENT NO. : 6,060,716
DATED : May 9, 2000
INVENTOR(S) : Yuich KAWASE

It is certified that error appears in the above-identified patent and that said Letters Patent is hereby corrected as shown below:

Column 2 Line 65 "FIG." should read --FIGS.--.

Claim 1 Column 6 Line 1 "Pattern" should read --pattern--.

Claim 1 Column 6 Line 2 "Parallel" should read --parallel--.

Claim 1 Column 6 Line 4 "Patterns" should read --patterns--.

Claim 1 Column 6 Line 5 "Polygonal" should read --polygonal--.

Signed and Sealed this

Third Day of April, 2001

*Attest:*

NICHOLAS P. GODICI

*Attesting Officer*  Acting Director of the United States Patent and Trademark Office